(12) United States Patent
Sewell et al.

(10) Patent No.: US 10,115,855 B2
(45) Date of Patent: Oct. 30, 2018

(54) CONDUCTIVE FOIL BASED METALLIZATION OF SOLAR CELLS

(71) Applicant: SUNPOWER CORPORATION, San Jose, CA (US)

(72) Inventors: Richard Hamilton Sewell, Los Altos, CA (US); David Aaron Randolph Barkhouse, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/283,249

(22) Filed: Sep. 30, 2016

(65) Prior Publication Data

US 2018/0097141 A1    Apr. 5, 2018

(51) Int. Cl.
| | | |
|---|---|---|
| H01L 33/18 | (2010.01) | |
| H01L 31/18 | (2006.01) | |
| H01L 31/05 | (2014.01) | |
| H01L 21/02 | (2006.01) | |

(52) U.S. Cl.
CPC ...... *H01L 31/188* (2013.01); *H01L 21/02697* (2013.01); *H01L 31/05* (2013.01); *H01L 31/0504* (2013.01); *H01L 31/0508* (2013.01); *H01L 31/1876* (2013.01)

(58) Field of Classification Search
CPC .............. H01L 31/05; H01L 31/0508; H01L 21/02697; H01L 31/0504
See application file for complete search history.

(56) References Cited

U.S. PATENT DOCUMENTS

| | | |
|---|---|---|
| 8,003,530 B2 | 8/2011 | Grohe et al. |
| 8,153,889 B2 | 4/2012 | Basol |
| 8,766,090 B2 | 7/2014 | Sewell et al. |
| 9,171,991 B2 | 10/2015 | Pearce et al. |
| 9,236,513 B2 | 1/2016 | Wiedman et al. |
| 9,307,650 B2 | 4/2016 | Krokoszinski et al. |
| 2012/0279546 A1* | 11/2012 | Kutzer ............ H01L 31/022441 136/244 |
| 2015/0093851 A1* | 4/2015 | Tu ........................... H01L 31/18 438/98 |

FOREIGN PATENT DOCUMENTS

WO     2013158796 A1    10/2013

OTHER PUBLICATIONS

Sewell, et al., U.S. Appl. No. 15/154,821 entitled "Roll-To-Roll Metallization of Solar Cells" filed May 13, 2016, 37 pgs.

(Continued)

*Primary Examiner* — Selim Ahmed
*Assistant Examiner* — Evan Clinton
(74) *Attorney, Agent, or Firm* — Schwabe, Williamson & Wyatt, P.C.

(57) ABSTRACT

Methods of fabricating a solar cell, and system for electrically coupling solar cells, are described. In an example, the methods for fabricating a solar cell can include forming a first cut portion from a conductive foil. The method can also include aligning the first cut portion to a first doped region of a first semiconductor substrate. The method can include bonding the first cut portion to the first doped region of the first semiconductor substrate. The method can also include aligning and bonding a plurality of cut portions of the conductive foil to a plurality of semiconductor substrates.

14 Claims, 13 Drawing Sheets

(56) References Cited

OTHER PUBLICATIONS

Terao, U.S. Appl. No. 14/752,750 entitled "Metallization and Stringing for Back-Contact Solar Cells" filed Jun. 26, 2015, 43 pgs.
Sewell, et al., U.S. Appl. No. 14/752,818 entitled "Wire Based Metallization for Solar Cells" filed Jun. 26, 2015, 36 pgs.
Sewell, et al., U.S. Appl. No. 15/089,401 entitled "Thermocompression Bonding Approaches for Foil-Based Metallization of Non-Metal Surfaces of Solar Cells" filed Apr. 1, 2016, 35 pgs.
International Search Report and Written Opinion from PCT/US2017/052557 dated Jan. 4, 2018, 12 pgs.

* cited by examiner

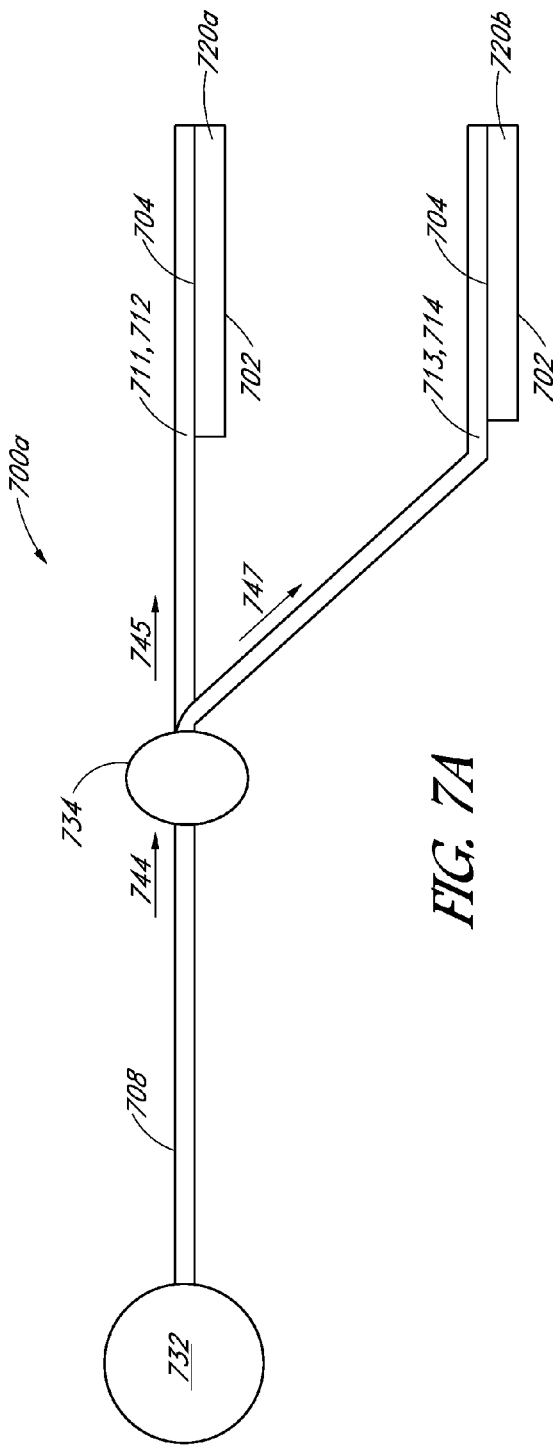
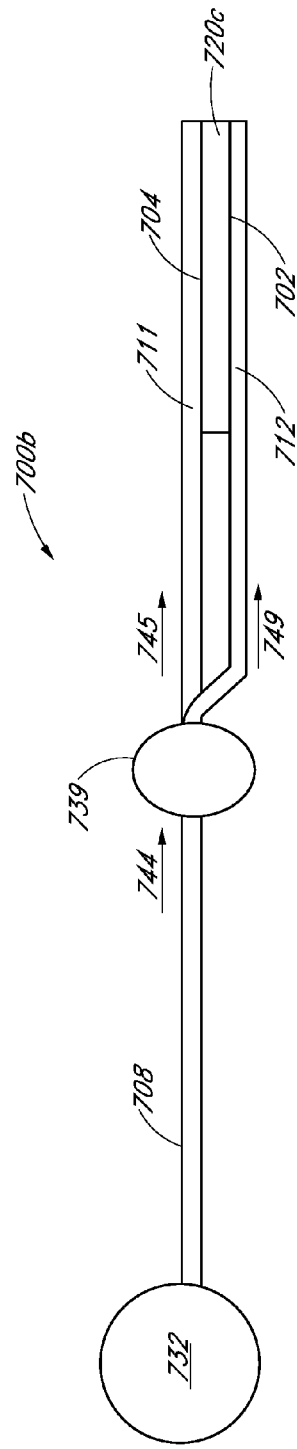
FIG. 7A
FIG. 7B

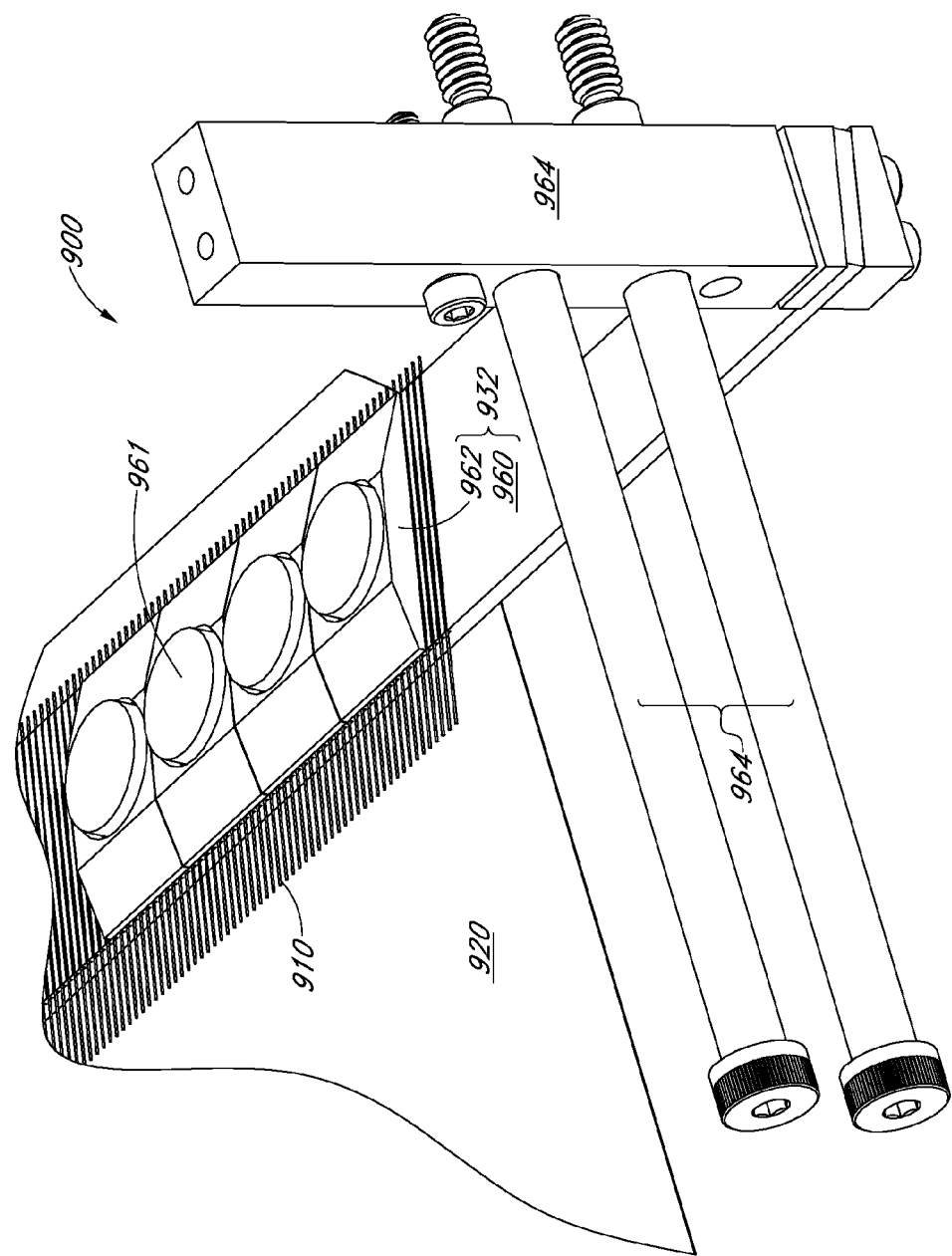

CONDUCTIVE FOIL BASED METALLIZATION OF SOLAR CELLS

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures.

BRIEF DESCRIPTION OF THE DRAWINGS

FIGS. 7A and 7B illustrate a cross-sectional view of two embodiments for the system for electrically coupling solar cells of FIG. 6, according to some embodiments.

FIGS. 9A, 9B and 9C illustrate another example system for electrically coupling solar cells, according to some embodiments.

DETAILED DESCRIPTION

Figure 1:
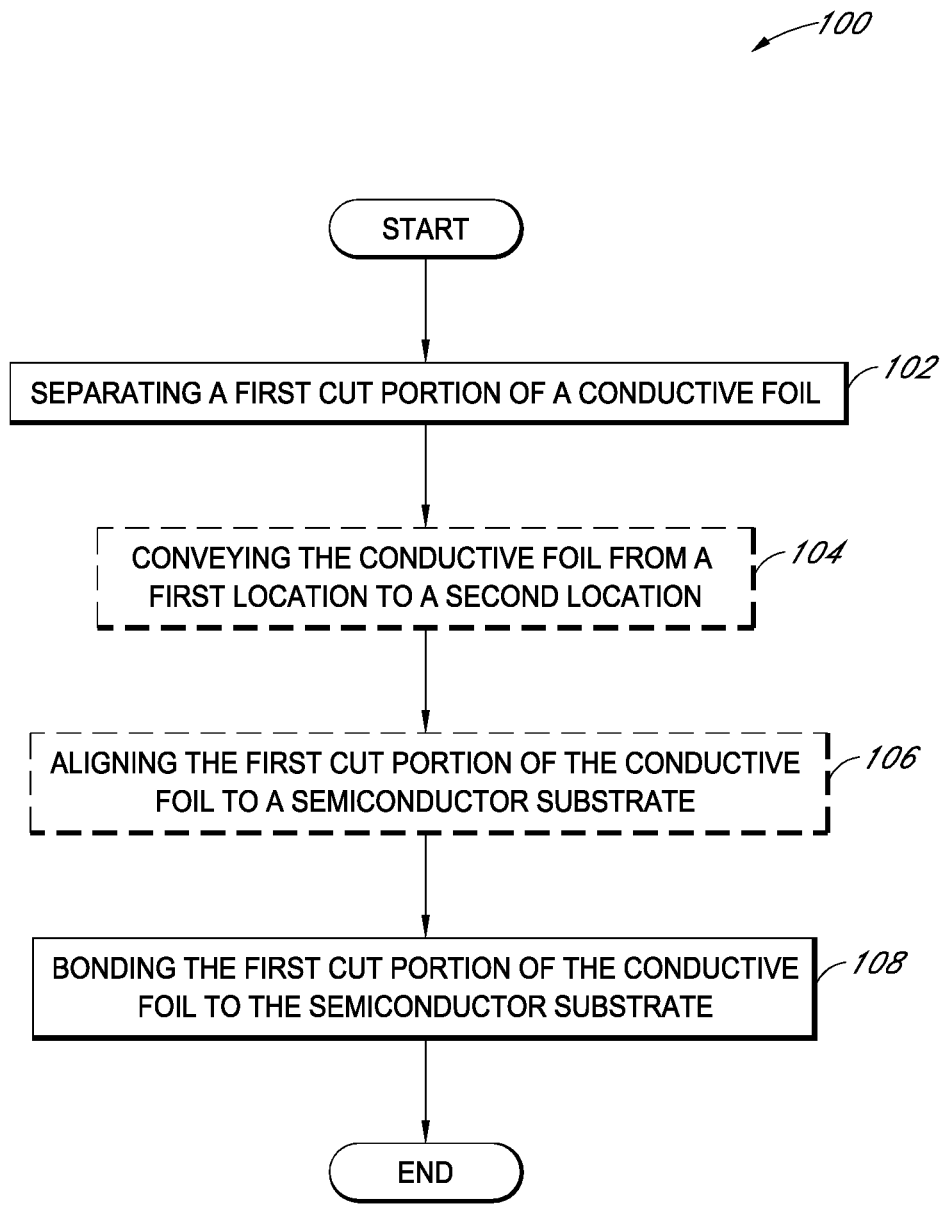
FIG. 1 is a flowchart listing operations in a method of metallization for solar cells, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" cut portion of a conductive foil does not necessarily imply that this cut portion is the first cut portion in a sequence; instead the term "first" is used to differentiate this cut portion from another cut portion of a conductive foil (e.g., a "second" cut portion). As used herein, a cut portion (e.g., a first cut portion, second cut portion, etc.) of the conductive foil can also be referred to as a portion (e.g., a first portion, second portion, etc.) of the conductive foil.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Metallization and stringing methods for solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Improvements in metallization methods for forming conductive contacts of solar cells are generally desirable. In contrast to some metallization methods, e.g., plating conductive contacts on a solar cell, other techniques can include bonding conductive foil and/or cut portions to a semiconductor substrate (e.g., a silicon substrate). Such methods can require loading and reloading a substantial number of wires into a bonding tool, which can be particularly challenging to setup and process. Techniques described herein provide for novel methods and apparatus to form cut portions from conductive foil and bonding the cut portions on a semiconductor substrate in a solar cell metallization process. Various examples are provided throughout.

Turning now to FIG. 1, a flowchart 100 listing operations in a method of metallization for solar cells is presented, according to some embodiments. In various embodiments, the method of FIG. 1 can include additional (or fewer) blocks than illustrated. For example, in some embodiments, another portion (e.g., a second cut portion) of the conductive foil can be separated, conveyed, aligned, and bonded to a semiconductor substrate.

Figure 2A:
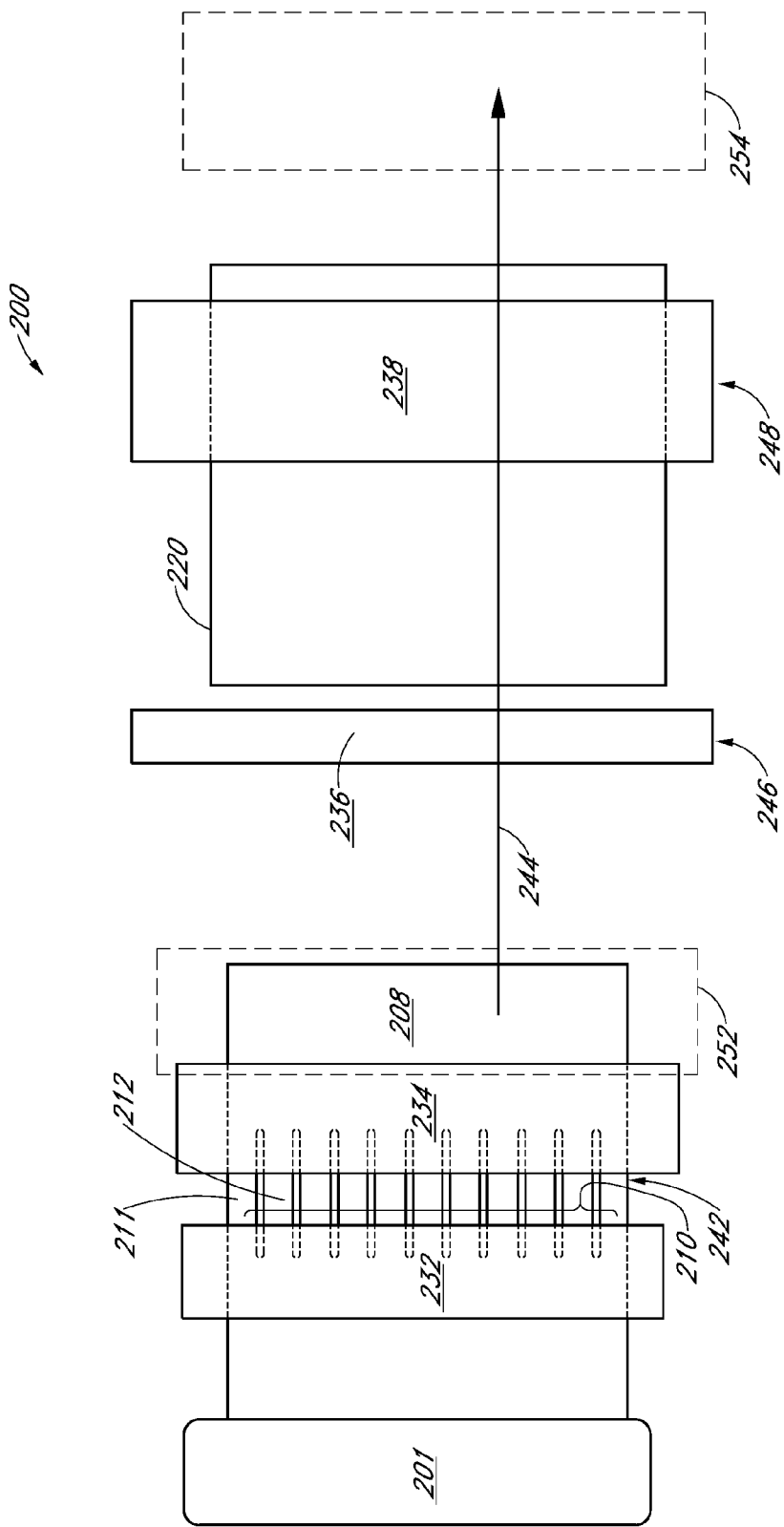
FIGS. 2A and 2B illustrate views of various stages in a metallization method for solar cells, corresponding to the operations in the method of FIG. 1, according to some embodiments.
Figure 2B:
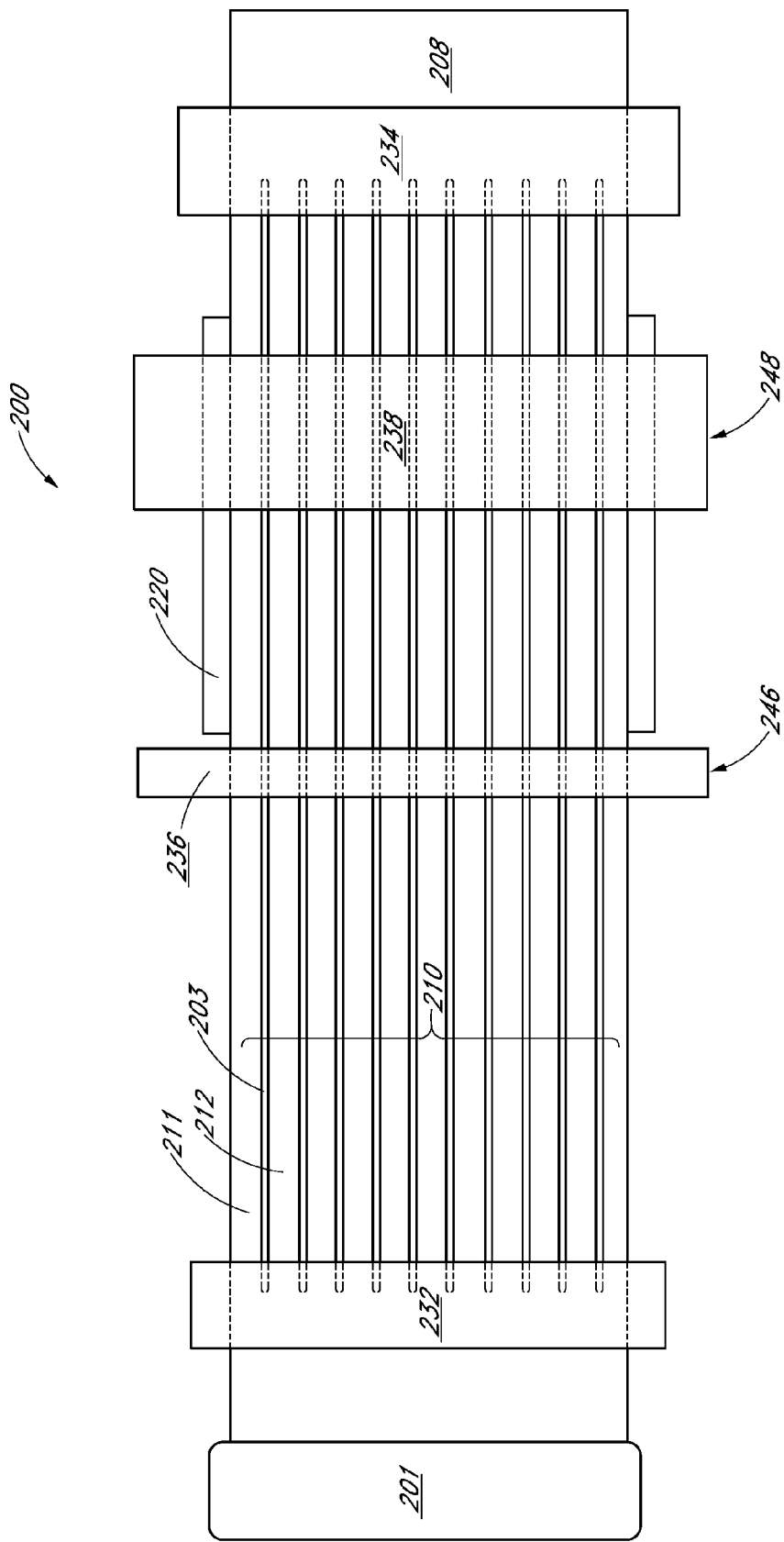

FIGS. 2A and 2B illustrate views of various stages in a metallization and stringing method for solar cells, corresponding to the operations in the method of FIG. 1, in according to some embodiments. FIGS. 2A and 2B also illustrate a system 200 for electrically coupling solar cells, according to some embodiments. The steps in the method of FIG. 1 and the components of the system of FIGS. 2A and 2B are described below.

Referring to FIG. 2A and corresponding to operation 102 of the flowchart 100, a first cut portion 211 of a conductive foil 208 can be separated 242. In an embodiment, a second cut portion 211 and/or a plurality of cut portions 210 can be separated from the conductive foil 208.

In an embodiment, the conductive foil 208 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment the conductive foil 208 can be a sheet of conductive foil, e.g., as shown.

In one embodiment, separating the first and/or second cut portions 211, 212 can include cutting, slitting or tearing the conductive foil 208. In an embodiment, a laser cutting process, performing a water-jet slitting process, a mechanical separation process, among other separation processes, can be performed to separate the first cut portion 211, a second cut portion 212 and/or a plurality of cut portions 210. In an example, performing a mechanical separation process can include using a knife and/or a saw to separate 242 the first cut portion 211, second cut portion 212 and/or a plurality of cut portions 210 from the conductive foil 208.

With reference to FIG. 2A and operation 104, the conductive foil 208 can be conveyed from a first location 252 to a second location 254, according to some embodiments. In an embodiment, a pick 234 can be used to convey the conductive foil 208 from a first location 252 (e.g., after a separation unit 232) to a second location 254 (e.g., after a semiconductor substrate 220) along a conveyance path 244. In an example, as depicted in FIG. 2A, a continuous length of the conductive foil 208 can be placed into a separation unit 232 from a dispenser unit 201, then transported along the conveyance path 244 over a semiconductor substrate 220 (e.g., as shown in FIG. 2B). The conveying 244 can also place the conductive foil 208 into an aligner 236 and a bonding unit 238. In an embodiment, the separation unit 232 can separate and/or cut the conductive foil 208 during the conveying 244. In some embodiments, the separation process can be performed after conveying 244 the conductive foil 208 over the solar cell 220, in contrast to performing the separation process (e.g., cutting) while conveying 244 as shown in FIG. 2B. In some embodiments, conveying 244 at block 104 is optional and need not be performed, where instead, the conductive foil 208 can be placed directly over the semiconductor substrate 220 (e.g., without conveying 244 at block 104).

Referring to FIG. 2B and operation 106, the first cut portion of the conductive foil 208 can be aligned to a semiconductor substrate, according to some embodiments. In an embodiment, an aligner unit 236 can be used to align 246 cut portions 211, 212 to the semiconductor substrate 220. In one example, the aligner unit 236 can include a plurality of slots and/or grooves to align the first and second cut portions 211, 212 to the semiconductor substrate 220. In one embodiment, the semiconductor substrate 220 is a solar cell. In an example, the first and second cut portions 211, 212 are aligned to doped regions (e.g., P-type and N-type doped regions) of the solar cell. In an embodiment, aligning the first cut portion 211 of the conductive foil 208 to a semiconductor substrate 210 can be optional. In some embodiments, the first cut portion 211 formed from the separation unit 232 can be aligned directly to the semiconductor substrate 210 (e.g., without an aligner unit).

With reference to FIG. 2B and operation 108, the first cut portion 211 can be bonded to the semiconductor substrate 220, according to some embodiments. In an embodiment, the second cut portion 212 can be bonded to the semiconductor substrate 220. In an embodiment, a bonding unit 238 can be used to bond 248 the first and second cut portions 211, 212 to the semiconductor substrate 220. In an embodiment, a laser welding process, thermocompression process, among other bonding processes, can be performed to bond the first and second cut portions 211, 212 to the semiconductor substrate 220.

FIGS. 2A and 2B illustrate a system for electrically coupling solar cells 200, according to some embodiments. In an embodiment, the system for electrically coupling solar cells 200 can include a dispenser unit 201, separation unit 232, a picker 234, an aligner 236, and a bonding unit 238, among other components. As discussed above, a conductive foil 208 can be placed into the system for electrically coupling solar cells 200, where the system 200 can separate cut portions 210, 211, 212 of the conductive foil 208, then bond the cut portions 210, 211, 212 to a semiconductor substrate 220. Although various components are shown, not all components are required for the operation of the system for electrically coupling solar cells 200. In an embodiment, the dispenser unit 201, is optional and need not be included.

In an embodiment, the dispenser unit 201 can include a roll of foil. In an embodiment, the picker 234 can include a mechanical clamp and/or a robotic mechanism to pick-up the conductive foil 208. In an embodiment the separation unit 232 can include laser cutting unit, a mechanical separation unit, among other separations units. In an example, the separation unit 232 can include a laser to cut the conductive foil 208 into the portions 210, 211, 212. In one example, the separation unit 232 can include a knife, saw, or any other type of mechanical slitting unit, to cut the conductive foil 208 and form the cut portions 210, 211, 212. In an embodiment, the separation unit 232 can separate a gap 203 between the first cut portion 211 and the second cut portion 212. In one embodiment, the width of the gap 203 can be based on the width between a first doped region and a second doped region of the semiconductor substrate 220. In an example, the separation unit can cut the gap 203 between the first and second cut portions 211, 212 to be greater than or equal to the width between a first doped region and a second doped region of the semiconductor substrate 220. In an embodiment, the aligner 236 can include a plurality of grooves and/or slots to receive the cut portions and align them to the semiconductor substrate 220. Although the grooves and/or slots can refer to a plurality of grooves and/or slots, in one embodiment, the aligner 236 can include instead a single groove and/or slot. In one embodiment, the aligner 236 can align the cut portions to doped regions of the semiconductor substrate 220. In an embodiment an embodiment, the bonding unit 238 can include a thermocompression roller, a laser welder or an ultrasonic bonding apparatus, among other bonding systems. In some embodiments, the aligner 232 is optional and need not be included. In an example, the separation unit 232 can create gap 203 based on the width between a first doped region and a second doped region of the semiconductor substrate 220 and effectively align the cut portions directly to the doped regions without an aligner.

Figure 3:
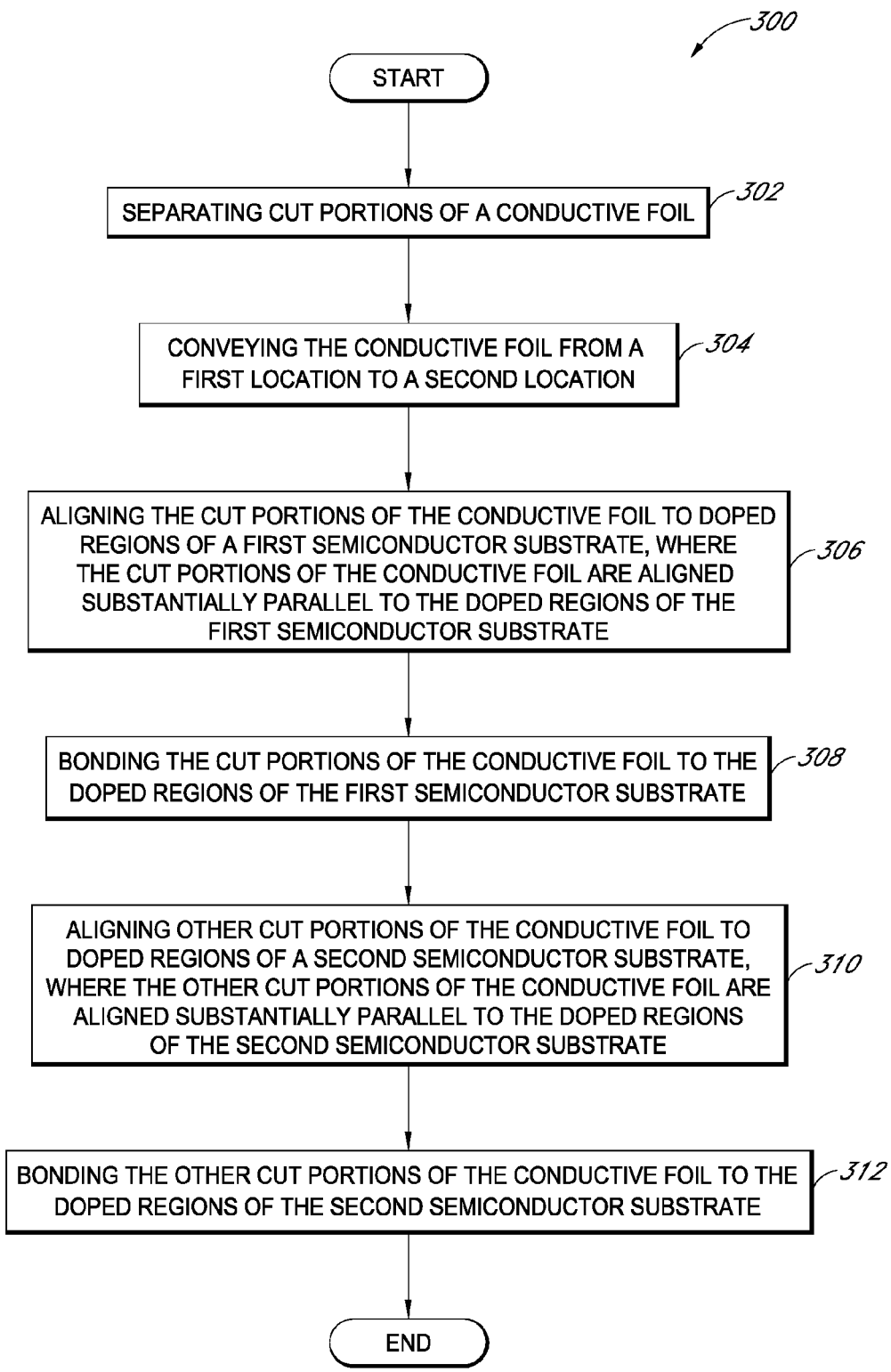
FIG. 3 is a flowchart listing operations in another method of metallization for solar cells, according to some embodiments.

Turning now to FIG. 3, another flowchart 300 listing operations in a metallization and/or stringing method for solar cells is presented, according to some embodiments. In various embodiments, the method of FIG. 1 can include additional (or fewer) blocks than illustrated. For example, in some embodiments, cut portions of a conductive foil can be aligned and bonded to a single semiconductor substrate, e.g., blocks 310 and 312 need not be performed.

Figure 4:
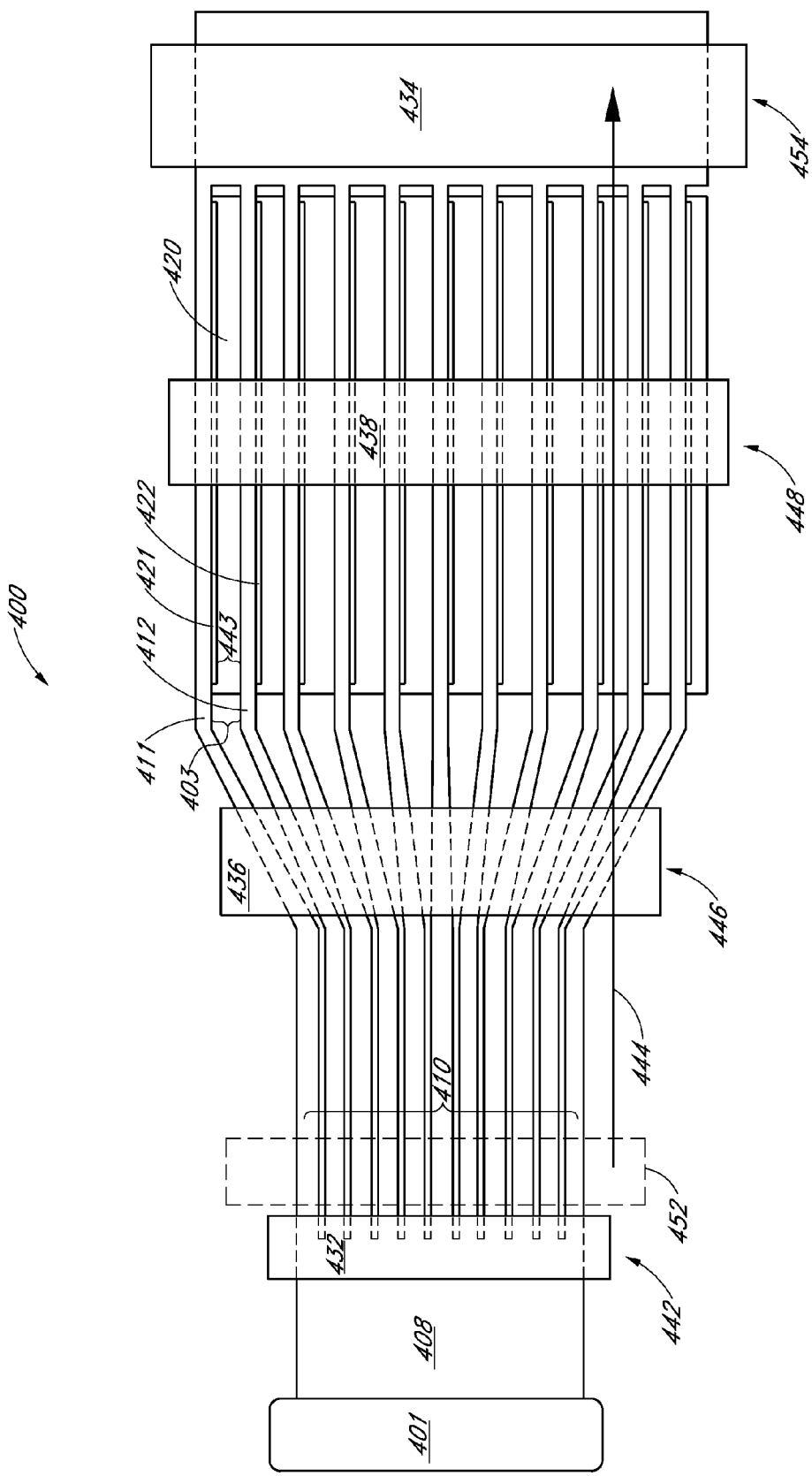
FIG. 4 illustrates various stages in a metallization and/or a stringing method for solar cells corresponding to the operations in the method of FIG. 3, and an example system for electrically coupling solar cells, according to some embodiments.

FIG. 4 illustrates views of various stages in a metallization and stringing method for solar cells, corresponding to the operations in the method of FIG. 3, in according to some embodiments. FIG. 4 also illustrates a system 400 for electrically coupling solar cells, according to some embodiments. As shown, the system for electrically coupling solar cells 400 of FIG. 4 has similar reference numbers to elements of the system 200 of FIGS. 2A and 2B, where like reference numbers refer to similar elements throughout the figures. In an embodiment, the structure of the system 400 of FIG. 4 is substantially similar to the structure of the system 200 of FIGS. 2A and 2B, except as described below. Unless otherwise specified below, the numerical indicators used to refer to components in FIG. 4 are similar to those used to refer to components or features in FIGS. 2A and 2B above, except that the index has been incremented by 200. Therefore the description of corresponding portions of FIGS. 2A and 2B apply equally to the description of FIG. 4, except as described below.

Referring to FIG. 4 and corresponding operation 302 of the flowchart 300, cut portions 410, 411, 412 of a conductive foil 408 can be separated 442.

In an embodiment, as referred herein cut portions 411, 412 can also be referred to as a first cut portion 411 and/or a second cut portion 412. Although the cut portions 410, 411, 412 of the conductive foil 408 can refer to a plurality of cut portions (e.g., 410 of FIG. 4, more than one cut portion), in one embodiment, the cut portions can instead refer to one cut portion (e.g., a first cut portion 411 or a second cut portion 412).

In an embodiment, the conductive foil 408 is an aluminum (Al) foil having a thickness approximately in the range of 5-100 microns. In one embodiment, the Al foil is an aluminum alloy foil (e.g., as discussed in FIGS. 2A and 2B). In one embodiment, the aluminum foil is an anodized aluminum foil and can be a sheet of conductive foil.

In one embodiment, separating the cut portions 410, 411, 412 can include cutting, slitting or tearing the conductive foil 408. In an embodiment, a laser cutting process, performing a water-jet slitting process, a mechanical separation process, among other separation processes, can be performed to separate a first cut portion 411, second cut portion 412 and/or a plurality of cut portions 410. In an example, performing a mechanical separation process can include using a knife and/or a saw to separate 442 the first cut portion 411, second cut portion 412 and/or a plurality of cut portions 410 from the conductive foil 408.

With reference to FIG. 4 and operation 304 of the flowchart 300, the conductive foil 408 can be conveyed from a first location 452 to a second location 454, according to some embodiments. In an embodiment, a pick 434 can be used to convey 444 the conductive foil 408 from a first location 452 (e.g., after a separation unit 432) to a second location 454 (e.g., after a semiconductor substrate 420) along a conveyance path 444. In an example, as depicted in FIG. 4, a continuous length of the conductive foil 408 can be placed into a separation unit 432 from a dispenser unit 401, then transported along the conveyance path 444 over a semiconductor substrate. The conveying 444 can also place the conductive foil 408 into an aligner 436 and a bonding unit 438. In an embodiment, the separation unit 432 can separate and/or cut the conductive foil 408 during the conveying 444. In some embodiments, the separation process can be performed after conveying 444 the conductive foil 408 over the solar cell 420, in contrast to performing the separation process (e.g., cutting) while conveying 444 as shown in FIG. 4. In some embodiments, conveying 444 at block 104 is optional and need not be performed, where instead, the conductive foil 408 can be placed directly over the semiconductor substrate 420 (e.g., without conveying 444 at block 104).

Referring again to FIG. 4 and operation 306 of the flowchart 300, the cut portions 410, 411, 412 of the conductive foil 408 can be aligned to doped regions 421, 422 a first semiconductor substrate 420, according to some embodiments. In an embodiment, an aligner unit 436 can be used to align 446 cut portions 410, 411, 412 to the doped regions 421, 422 of the first semiconductor substrate 420. In one embodiment, a first cut portion 411 can be aligned to a first doped region 421. In an example, as shown, the aligner 432 can align 446 the first cut portion 411 substantially parallel to the first doped region 421. In an embodiment, a second cut portion 412 can be aligned to a second doped region 422. In an example, as shown, the aligner 436 can align 446 the second cut portion 412 substantially parallel to the second doped region 422. In one embodiment, the aligner unit 436 can include a plurality of slots and/or grooves to align the cut portions 410, 411, 412 to the doped regions 421, 422 of the first semiconductor substrate 420. In an embodiment, the doped regions are P-type and/or N-type doped regions of the first semiconductor substrate 420. In one embodiment, the first semiconductor substrate 420 is a solar cell. In an embodiment, the aligner 436 can be used to align a gap 403 between a first cut portion 411 and the second cut portion 412. In an embodiment, the aligner can align the gap 403 based on a width 443 between a first doped region 421 and a second doped region 422. In an example, the aligner 432 can align the gap 403 to be greater than or equal to the width 443 between the first and second doped regions 421, 422. In one example, the aligner 436 can spread the cut portions 411, 412 to align the cut portions 411, 412 to the doped regions 421, 422 as shown in FIG. 4.

With reference to FIG. 4 and operation 308, the cut portions 411, 412 can be bonded to the doped regions 421, 422 of the semiconductor substrate 420, according to some embodiments. In an embodiment, a first cut portion 411 can be bonded to a first doped region 421 of the semiconductor substrate 420. In one embodiment, a second cut portion 412 can be bonded to a second doped region 422 of the semiconductor substrate 420. In an embodiment, the first and second doped regions 421, 422 can disposed on a same side (e.g., a back side or a front side) of the first semiconductor substrate 420. In an embodiment, the first semiconductor substrate 420 can be a solar cell, where the solar cell can include a front side and a back side. In an embodiment, a bonding unit 438 can be used to bond 448 the first and second cut portions 411, 412 to the semiconductor substrate 420. In an embodiment, a laser welding process, thermocompression process, ultrasonic bonding process, among other bonding processes, can be performed to bond the first and second cut portions 411, 412 to the first and second doped regions 421, 422 of the semiconductor substrate 420. In one embodiment, a plurality of cut portions 410 can be bonded to a plurality of doped regions of the semiconductors substrate 420.

FIG. 4 illustrates a system for electrically coupling solar cells 400, according to some embodiments. In an embodiment, the system for electrically coupling solar cells 400 can include a dispenser unit 401, separation unit 432, a picker 434, an aligner 436, and a bonding unit 438, among other components. As discussed above, a conductive foil 408 can be placed into the system for electrically coupling solar cells 400, where the system 400 can separate cut portions 410, 411, 412 of the conductive foil 408, then bond the cut portions 410, 411, 412 to a semiconductor substrate 420. Although various components are shown, not all components are required for the operation of the system for electrically coupling solar cells 400. In an embodiment, the dispenser unit 401, is optional and need not be included.

In an embodiment, the dispenser unit 401 can include a roll of foil. In an embodiment, the picker 432 can include a mechanical clamp and/or a robotic mechanism to pick-up the conductive foil 408. In an embodiment the separation unit 432 can include a knife, saw, laser cutting unit, performing a water jet unit, a mechanical separation unit, among other separations units. In an example, the separation unit 432 can include a laser to cut the conductive foil 408 into the portions 410, 411, 412. In one example, the separation unit 432 can include a knife, or any other type of mechanical slitting unit, to cut the conductive foil 408 and form the cut portions 410, 411, 412. In an embodiment, the aligner 436 can include a plurality of grooves and/or slots to receive the cut portions and align them to the semiconductor substrate 420. Although the grooves and/or slots can refer to a plurality of grooves and/or slots, in one embodiment, the aligner 436 can include to one groove and/or slot. In one embodiment, the aligner 436 can align the cut portions 411, 412 to doped regions 421, 422 of the semiconductor substrate 420. In an embodiment, the aligner 436 can align 444 the first and second cut portions 411, 412 substantially parallel to first and second doped regions 421, 422 of the semiconductor substrate 420. In one example, the aligner 436 can spread the cut portions 411, 412 to align the cut portions 411, 412 to the doped regions 421, 422 as shown in FIG. 4. In an embodiment, the bonding unit 438 can include a thermocompression roller, a laser welder or an ultrasonic bonding apparatus, among other bonding systems.

Figure 5:
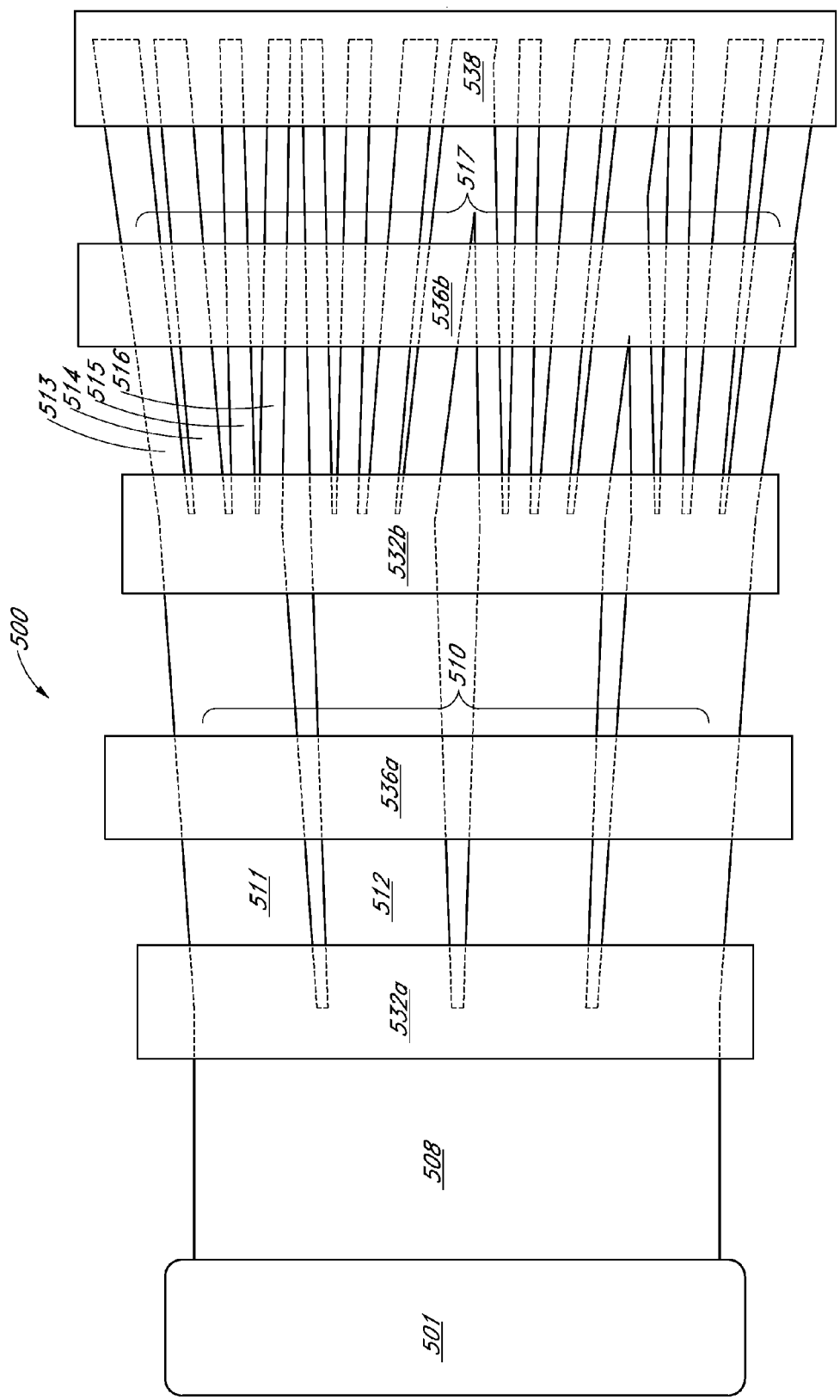
FIG. 5 illustrates a portion of another example system for electrically coupling solar cells, according to some embodiments.

FIG. 5 illustrates a portion of another system for electrically coupling solar cells 500, according to some embodiments. As shown, the portion of the system for electrically coupling solar cells 500 of FIG. 5 has similar reference numbers to elements of the system 400 of FIG. 4, where like reference numbers refer to similar elements throughout the figures. In an embodiment, the structure of the system 500 of FIG. 5 is substantially similar to the structure of the system 400 of FIG. 4, except as described below. Unless otherwise specified below, the numerical indicators used to refer to components in FIG. 5 are similar to those used to refer to components or features in FIG. 4, except that the index has been incremented by 100. Therefore the description of corresponding portions of FIG. 4 applies equally to the description of FIG. 5, except as described below.

In an embodiment, the portion of the system for electrically coupling solar cells 500 can include a dispenser unit 501, a first separation unit 532a, a first aligner 536a, a second separation unit 532b, a second aligner 536b, and a bonding unit 538. In an embodiment, a conductive foil 508 can be placed into the first separation unit 532a from the dispenser unit 501. In an embodiment, the first separation unit 532a can separate a first cut portion 511 and a second cut portion 512 from the conductive foil 508. In an embodiment, the first aligner can receive the first and second cut portions 511, 512 and align the cut portions 511, 512 to the second separation unit 532b. In an example, the aligner can spread the first cut portion away from the second cut portion. In an embodiment, the first separation unit can separate a first plurality of cut portions 510. In one embodiment, the first aligner 536a can align the first plurality of cut portions 510 to the second separation unit 532b. In an embodiment, the second separation unit 532b can separate a third cut portion 513 and a fourth cut portion 514 from the first cut portion 511. In an embodiment, the second separation unit 532b can separate a fifth cut portion 515 and a sixth cut portion 516 from the second cut portion 512. In an embodiment, the second aligner 536b can receive the third, fourth, fifth and sixth cut portions 513, 514, 515, and 516 and align the cut portions 513, 514, 515, 516 to the bonding unit 534. In one embodiment, the second aligner 536b can align the cut portions 513, 514, 515, 516 to doped regions of a semiconductor substrate. In an example, the second aligner 536b can align the cut portions 513, 514, 515, 516 substantially parallel to doped regions of a semiconductor substrate. In an example, the second separation unit 532b can separate a second plurality of cut portions 517. In one embodiment, the second aligner 536b can align the second plurality of cut portions 517 to a semiconductor substrate. In an example, a third cut portion 513 and a fourth cut portion 514 can be aligned to a first doped region and a second doped region of the semiconductor substrate. In one example, the fifth cut portion 515 and a sixth cut portion 516 can be aligned to a third doped region and a fourth doped region of the semiconductor substrate. In an embodiment, the bonding unit 538 can bond the cut portions 513, 514, 515, 516, and 517 to a plurality of doped regions (e.g., a first doped region, second doped region, etc.) of a semiconductor substrate. In an example, third and fourth cut portions 513, 514 can be bonded to the first and second doped regions and the fifth and sixth cut portions 515, 516 bonded to the third and fourth doped regions of a semiconductor substrate, respectively.

In an embodiment the first and second separation unit 532a, 532b can include laser cutting unit, a mechanical separation unit, among other separations units. In an example, the first and second separation units 532a, 532b can include a laser, a knife, saw, or any other type of slitting unit, to cut the conductive foil 508 and form the cut portions 510, 511, 512, 513, 514, 515, 516, 517.

In an embodiment, the first and second aligners 536a, 536b can include a plurality of grooves and/or slots to receive the cut portions 510, 511, 512, 513, 514, 515, 516, 517 and align the cut portions to a semiconductor substrate. Although the grooves and/or slots can refer to a plurality of grooves and/or slots, in one embodiment, the first and second aligners 536a, 536b can include one groove and/or slot. In an embodiment, the bonding unit 538 can include a thermocompression roller, a laser welder or an ultrasonic bonding apparatus, among other bonding systems.

Various components are shown, where not all components are required for the operation of the system for electrically coupling solar cells 500. In an embodiment, the dispenser unit 501, is optional and need not be included.

Figure 6:
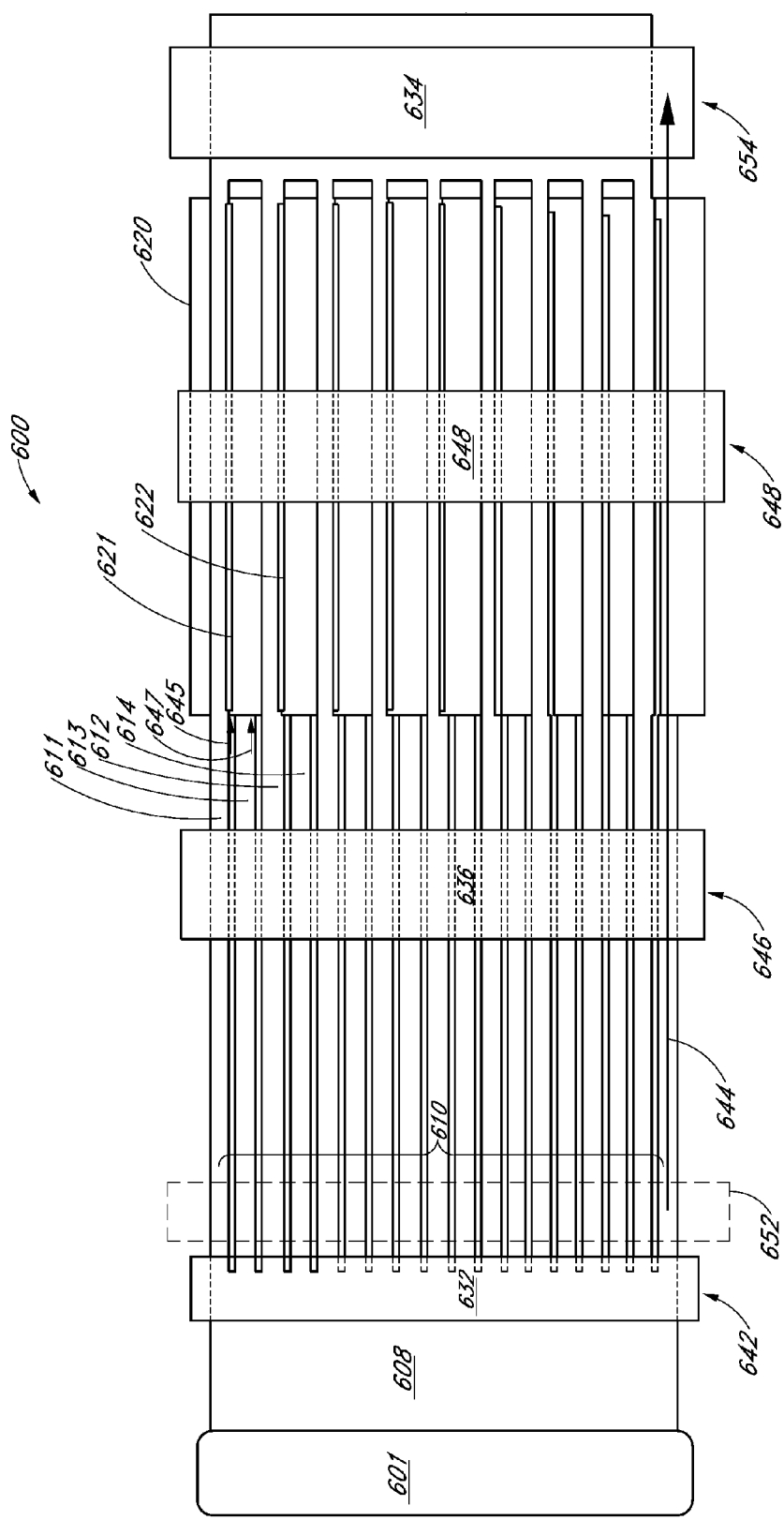
FIG. 6 illustrates various stages in a metallization and/or a stringing method for solar cells corresponding to the operations in the method of FIG. 3, and another example system for electrically coupling solar cells, according to some embodiments.

FIG. 6 illustrates views of various stages in a metallization and stringing method for solar cells, corresponding to the operations in the method of FIG. 3, in according to some embodiments. FIG. 6 also illustrates a system 600 for electrically coupling solar cells, according to some embodiments. As shown, the system for electrically coupling solar cells 600 of FIG. 6 has similar reference numbers to elements of the system 400 of FIG. 4, where like reference numbers refer to similar elements throughout the figures. In an embodiment, the structure of the system 600 of FIG. 6 is substantially similar to the structure of the system 400 of FIG. 4, except as described below. Unless otherwise specified below, the numerical indicators used to refer to components in FIG. 6 are similar to those used to refer to components or features in FIG. 4 above, except that the index has been incremented by 200. Therefore the description of corresponding portions of FIG. 4 applies equally to the description of FIG. 6, except as described below.

Referring to FIG. 6 and corresponding operation 302 of the flowchart 300, cut portions 610, 611, 612 of a conductive foil 608 can be separated 642.

In an embodiment, as referred herein portions 611, 612 can also be referred to as a first cut portion 611 and/or a second cut portion 612. Although the cut portions 610, 611, 612 of the conductive foil 608 can refer to a plurality of cut portions (e.g., 610 of FIG. 6, more than one cut portion), in one embodiment, the cut portions can instead refer to a single cut portion (e.g., a first cut portion 611 or a second cut portion 612).

In an embodiment, the conductive foil 608 is an aluminum (Al) foil having a thickness approximately in the range of 5-100 microns. In one embodiment, the Al foil is an aluminum alloy foil (e.g., as discussed in FIGS. 2A and 2B). In one embodiment, the aluminum foil is an anodized aluminum foil and can be a sheet of conductive foil.

In one embodiment, separating the cut portions 610, 611, 612 can include cutting, slitting or tearing the conductive foil 608. In an embodiment, a laser cutting process, performing a water jet slitting process, a mechanical separation process, among other separation processes, can be performed to separate a first cut portion 611, second cut portion 612 and/or a plurality of cut portions 610 from the conductive foil 608. In an example, performing a mechanical separation process can include using a knife and/or a saw to separate 642 the first cut portion 611, second cut portion 612 and/or a plurality of cut portions 610 from the conductive foil 608.

With reference to FIG. 6 and operation 304 of the flowchart 300, the conductive foil 608 can be conveyed from a first location 652 to a second location 654, according to some embodiments. In an embodiment, a pick 634 can be used to convey 644 the conductive foil 608 from a first location 652 (e.g., after a separation unit 632) to a second location 654 (e.g., after a semiconductor substrate 620) along a conveyance path 644. In an example, as depicted in FIG. 6, a continuous length of the conductive foil 608 can be placed into a separation unit 632 from a dispenser unit 601, then transported along the conveyance path 644 over a semiconductor substrate. The conveying 644 can also place the conductive foil 608 into an aligner 637 and a bonding unit 638. In an embodiment, the separation unit 632 can separate and/or cut the conductive foil 408 during the conveying 644. In some embodiments, the separation process can be performed after conveying 644 the conductive foil 408 over the solar cell 620. In some embodiments, conveying 644 at block 104 is optional and need not be performed, where instead, the conductive foil 608 can be placed directly over the semiconductor substrate 620 (e.g., without conveying 644 at block 104).

Referring to FIG. 6, operation 306 and operation 310 of the flowchart 300, the cut portions of the conductive foil 608 can be aligned to doped regions of plurality of semiconductor substrates, according to some embodiments. In an embodiment, referring to FIG. 6 and operation 306, cut portions 611, 612 can be aligned 645 to doped regions of a first semiconductor substrate, as shown. In reference to FIG. 6 and operation 310, cut portions 613, 614 can be aligned 647 to doped regions of a another semiconductor substrate, as discussed in FIG. 7A. In an embodiment, cut portions 611, 612, 613, 614 can be aligned 645, 647 to doped regions disposed on a side (e.g., a back side or a front side) of the first semiconductor substrate and or a plurality of substrates. In some embodiments, cut portions 613, 614 can instead be discarded.

Referring again to FIG. 6 and operation 306 of the flowchart 300, the cut portions of the conductive foil 608 can be aligned 645 to doped regions of a first semiconductor substrate 620, according to some embodiments. In an embodiment, a first cut portion 611 can be aligned to a first doped region 621 of the first semiconductor substrate 620. In one embodiment, the second cut portion 612 can be aligned to a second doped region 622 of the first semiconductor substrate. In an embodiment, the first and second doped regions 621, 622 can disposed on a same side (e.g., a back side or a front side) of the first semiconductor substrate 620. In an example, the aligner 634 can align 645 the first and second cut portions 611, 612 to first and second doped regions 621, 622 disposed on a back side or a front side of the first semiconductor substrate 620. In one example, the aligner 436 can spread the cut portions 611, 612 to align the cut portions 611, 612 to the doped regions 621, 622, (e.g., also referring to FIG. 4). In one embodiment, the aligner unit 636 can include a plurality of slots and/or grooves to align 645 the cut portions 611, 612 to the doped regions 621, 622 of the first semiconductor substrate 620. In an embodiment, the doped regions are P-type and/or N-type doped regions of the first semiconductor substrate 620. In an embodiment, the first semiconductor substrate 620 can be a solar cell.

With reference to FIG. 6 and operation 308, the cut portions 611, 612 can be bonded to the doped regions 621, 622 of the first semiconductor substrate 620, according to some embodiments. In an embodiment, a first cut portion 611 can be bonded to a first doped region 621 of the semiconductor substrate 620. In one embodiment, a second cut portion 612 can be bonded to a second doped region 622 of the semiconductor substrate 620. In an embodiment, the first and second doped regions 621, 622 can disposed on a same side (e.g., a back side or a front side) of the first semiconductor substrate. In an embodiment, a bonding unit 638 can be used to bond 648 the first and second cut portions 611, 412 to the semiconductor substrate 620. In an embodiment, a laser welding process, thermocompression process, ultrasonic bonding process, among other bonding processes, can be performed to bond the first and second cut portions 611, 612 to the first and second doped regions 621, 622 of the semiconductor substrate 620. In one embodiment, a plurality of cut portions 610 can be bonded to a plurality of doped regions of the semiconductors substrate 620.

Referring again to FIG. 6, FIG. 7A and operation 310 of the flowchart 300, the other cut portions 613, 614 of the conductive foil 608 can be aligned 647 to doped regions of a second semiconductor substrate (e.g., a second semiconductor substrate 720b as shown in FIG. 7A), according to some embodiments. With reference to FIG. 7A, there is shown a cross-sectional example of the system for electrically coupling solar cells 600. In an embodiment, the system for electrically coupling solar cells 700 of FIG. 7A have similar reference numbers to elements of the system 600 of FIG. 6, where the description of corresponding portions of FIG. 6 applies equally to the description of FIG. 7A. In an example, the cut portions 613, 614 refer to the same cut portions 713, 714. In an embodiment, a third cut portion 613 can be aligned 647 to a first doped region of a second semiconductor substrate. In one embodiment, a fourth cut portion 614 can be aligned to a second doped region of the second semiconductor substrate. In an embodiment, the first and second doped regions can disposed on a same side (e.g., a back side or a front side) of the second semiconductor substrate 620. In an embodiment, the second semiconductor substrate can be a solar cell.

With reference to FIG. 6, FIG. 7A, and operation 312, the other cut portions 613, 614 can be bonded to the doped regions of the other semiconductor substrate (e.g., a second semiconductor substrate 720b as shown in FIG. 7A), according to some embodiments. In an embodiment, a third cut portion 613 can be bonded to a first doped region of the second semiconductor substrate. In one embodiment, a fourth cut portion 614 can be bonded to a second doped region of the semiconductor substrate. In an embodiment, a bonding unit 638 can be used to bond 648 the third and fourth cut portions 613, 614 to the semiconductor substrate 620. In an embodiment, a laser welding process, thermocompression process, ultrasonic bonding process, among other bonding processes, can be used. As discussed above, the system for electrically coupling solar cells 700 of FIG. 7A have similar reference numbers to elements of the system 600 of FIG. 6, where the description of corresponding portions of FIG. 6 applies equally to the description of FIG. 7A

Although a first, second, third and fourth cut portions are discussed above, in an embodiment, a plurality of cut portions, e.g., more than one, two, etc., can be used. In one example, a plurality of cut portions 610 can be aligned and/or bonded to a plurality of doped regions of a plurality of semiconductors substrates.

FIGS. 7A and 7B illustrate different embodiments a portion of system for electrically coupling solar cells 600 of FIG. 6, according to some embodiments. As shown, the portion of the system for electrically coupling solar cells 700 of FIGS. 7A and 7B have similar reference numbers to elements of the system 600 of FIG. 6, where like reference numbers refer to similar elements throughout the figures. In an embodiment, the structure of the system 700 of FIGS. 7A and 7B are substantially similar to the structure of the system 600 of FIG. 6, except as described below. Unless otherwise specified below, the numerical indicators used to refer to components in FIGS. 7A and 7B are similar to those used to refer to components or features in FIG. 6, except that the index has been incremented by 100. Therefore the description of corresponding portions of FIG. 6 applies equally to the description of FIGS. 7A and 7B, except as described below.

Referring to FIG. 7A, operation 306, 308, 10 and operation 312 of the flowchart 300, cut portions 711, 712, 713, 714 of the conductive foil 708 can be aligned and bonded to doped regions of a first and second of semiconductor substrates 720a, 720b, according to some embodiments. In an embodiment, the first and second cut portions 711, 712 can be aligned 745 and bonded to doped regions of the first semiconductor substrate 720a. In an embodiment, the second and third cut portions 713, 714 can be aligned 747 and bonded to doped regions of the second semiconductor substrate 720b. In an embodiment, first and second cut portions 711, 712 can be aligned 745 and bonded to doped regions disposed on a back side 704 of the first semiconductor substrate 720a. In an embodiment, third and fourth cut portions 713, 714 can be aligned 747 and bonded to doped regions disposed on a back side 704 of the second semiconductor substrate 720b. In some embodiments, the third and fourth cut portions 711, 712, 713, 714 can be aligned 745, 747 and bonded to the front side of the first and second semiconductor substrates 720a, 720b, respectively. In some embodiments, third and fourth cut portions 712, 714 need not be aligned and bonded, where the second cut portions can instead be discarded.

Referring to FIG. 7B, cut portions 711, 712 of the conductive foil 708 can be aligned 745, 759 and bonded to doped regions on a front and back side 704, 702 of a semiconductor substrate 720c, according to some embodiments. In an embodiment, the first cut portion 711 can be aligned and bonded to doped regions on a back side 704 of the semiconductor substrate 720c. In an embodiment, the second cut portion 712 can be aligned and bonded to doped regions on a front side 702 of the semiconductor substrate 720c. In some embodiments, second cut portions 712 need not be aligned and bonded, where the second cut portions can instead be discarded. Although not shown, a bonding unit can be positioned over and/or under the solar cell 720c to bond the cut portions to doped regions (e.g., on the front and/or back side) of the solar cell 720c.

Figure 8A:
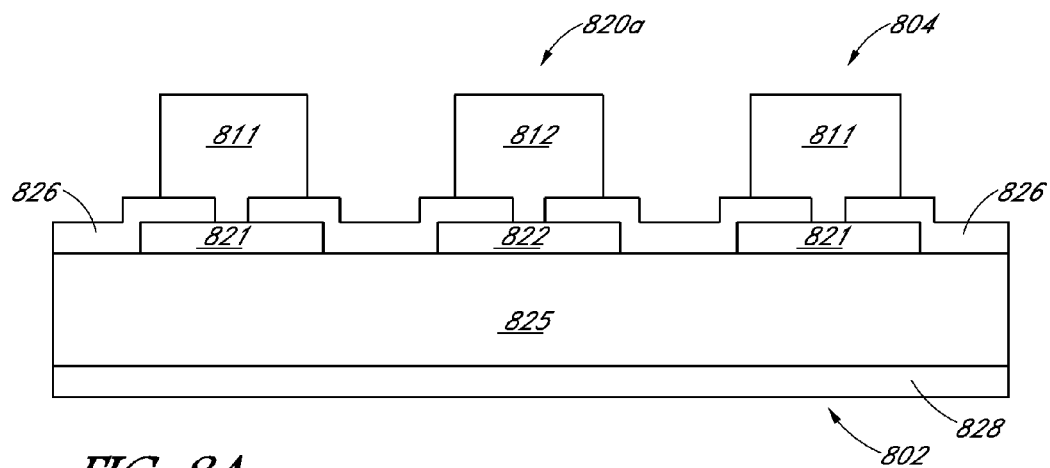
FIGS. 8A and 8B illustrate example solar cells fabricated from the methods of FIGS. 1-7, according to some embodiments.
Figure 8B:
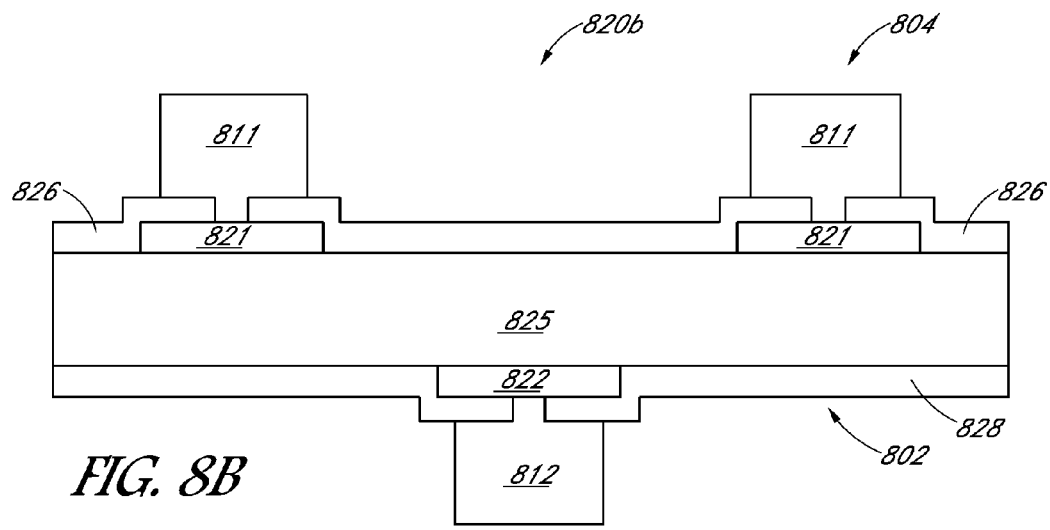

FIGS. 8A and 8B illustrates example semiconductor substrates fabricated using the methods of FIGS. 1-7, according to some embodiments. As shown, the semiconductor substrates 820a, 820b of FIG. 8 have similar reference numbers to elements of the semiconductor substrates discussed in the previous figures, where like reference numbers refer to similar elements throughout the figures. In an embodiment, the structure of the semiconductor substrates 820a, 820b of FIG. 8 are substantially similar to the structure of the semiconductor substrates of the previous figures, except as described below. Unless otherwise specified below, the numerical indicators used to refer to components of the semiconductor substrates in FIG. 8 are similar to those used to refer to components or features of the previous figures. Therefore the description of corresponding portions of the semiconductor substrates in the previous figures applies equally to the description of the semiconductor substrates of FIG. 8, except as described below.

In an embodiment, the semiconductor substrates 820a, 820b are solar cells 820a, 820b. In an embodiment, the solar cells 820a, 820b can include a silicon substrate 825. In some embodiments, the silicon substrate can be cleaned, polished, planarized and/or thinned or otherwise processed. In an embodiment, the semiconductor substrate 825 can be single-crystalline or a multi-crystalline silicon substrate. In an embodiment, the silicon substrate can be an N-type or a P-type silicon substrate. In an example, the silicon substrate 825 can be a monocrystalline silicon substrate, such as a bulk single crystalline N-type doped semiconductor substrate. In an embodiment, the solar cells 820a, 820b can have a front side 802 and a back side 804, where the front side 802 is opposite the back side 804. In one embodiment, the front side 802 can be referred to as a light receiving surface 802 and the back side 804 can be referred to as a back surface 804. In an embodiment, the solar cells 820a, 820b can include a first doped region 821 and a second doped region 822. In an embodiment, the first doped region 821 can be a P-type doped region (e.g., doped with boron) and the second doped region 822 can be an N-type doped region (e.g., doped with phosphorus). In an embodiment, the solar cells 820a, 820b can include an anti-reflective coating (ARC) 828 on the front side 802 of the solar cells. In some embodiments, the solar cells 820a, 820b can include a back anti-reflective coating (BARC) 826 on the back side 804 of the solar cells.

Referring to FIG. 8A, an example back-contact solar cell fabricated from the methods of FIGS. 1-7 is shown, according to some embodiments. The back-contact solar cell 820a can include the first and second doped regions 821, 822 disposed on a back side 804 of a solar cell 820a. In an embodiment, first and second cut portions 811, 812 can be bonded to the first and second doped regions 821, 822 on the back side 804 of a solar cell 820a.

With Reference to FIG. 8B, an example front-contact solar cell fabricated from the methods of FIGS. 1-7 is shown, according to some embodiments. The front-contact solar cell 820b can include the first doped region 821 disposed on the back side 804 of the solar cell 820b. In an example, the second doped region 822 can be disposed on the front side 802 of the solar cell 820b. Although one example of a second doped region 822 is shown, one or more, of the second doped region 822 can be used. In an embodiment, first and second cut portions 811, 812 can be bonded to the first and second doped regions 821, 822 on the front and back sides 804 of the solar cell 820b.

Figure 8C:
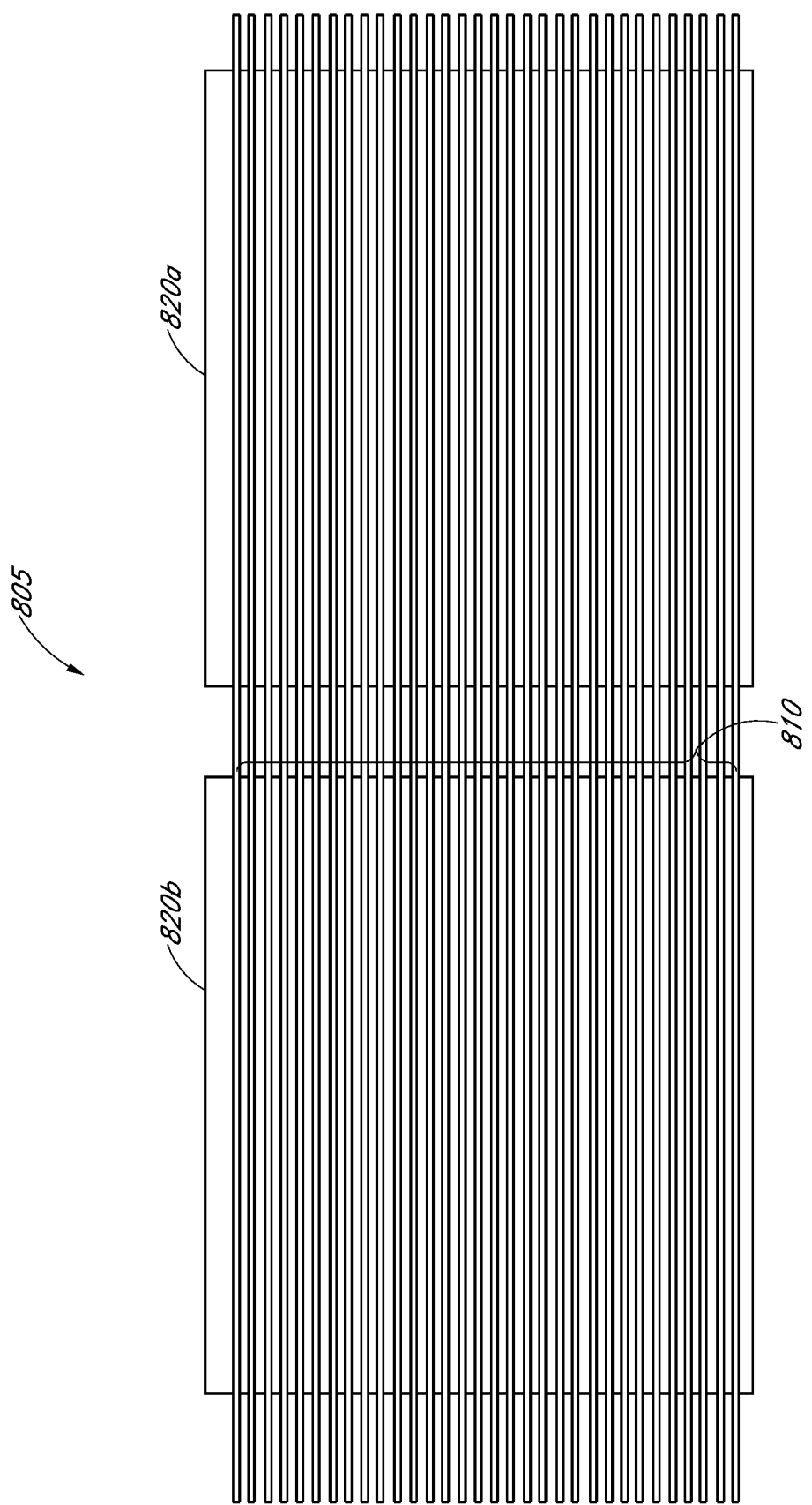
FIG. 8C illustrates an example solar cell string fabricated from the methods of FIGS. 1-7, according to some embodiments.

FIG. 8C illustrates a string of solar cells 805 fabricated from the methods of FIGS. 1-7, according to some embodiments. In an embodiment, the string of solar cells 805 can include a first and second semiconductor substrates 820a, 820b. In one embodiment, a plurality of cut portions 810 from a conductive foil can be bonded to doped regions of the first and second semiconductor substrates 820a, 820b. In an embodiment, a plurality of cut portions 810 from a conductive foil can electrically connect (e.g., string) the first semiconductor substrate 820a to the second semiconductor substrate 820b. In an embodiment, the first and second semiconductor substrates 820a, 820b can be solar cells.

Figure 9A:
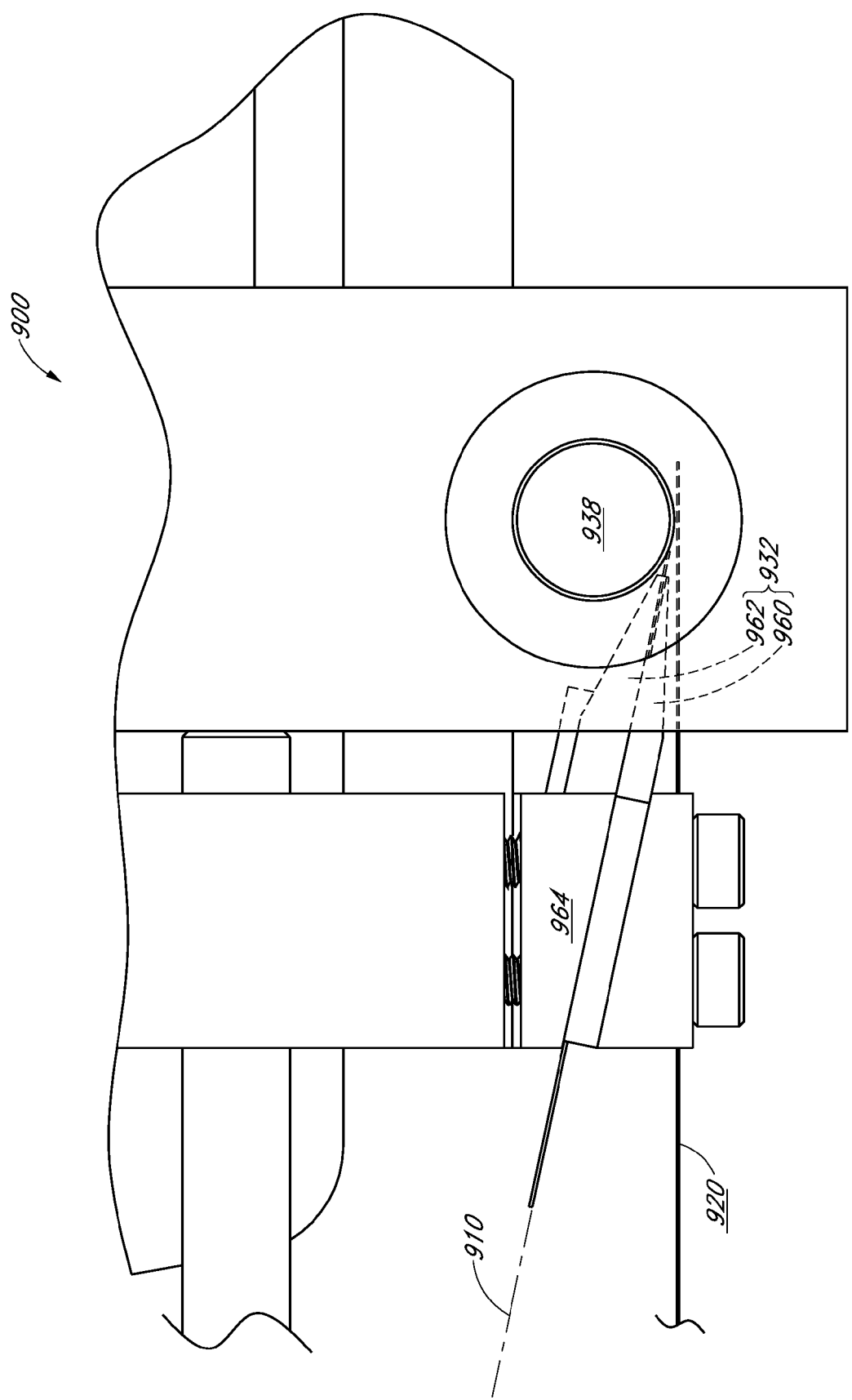
Figure 9C:
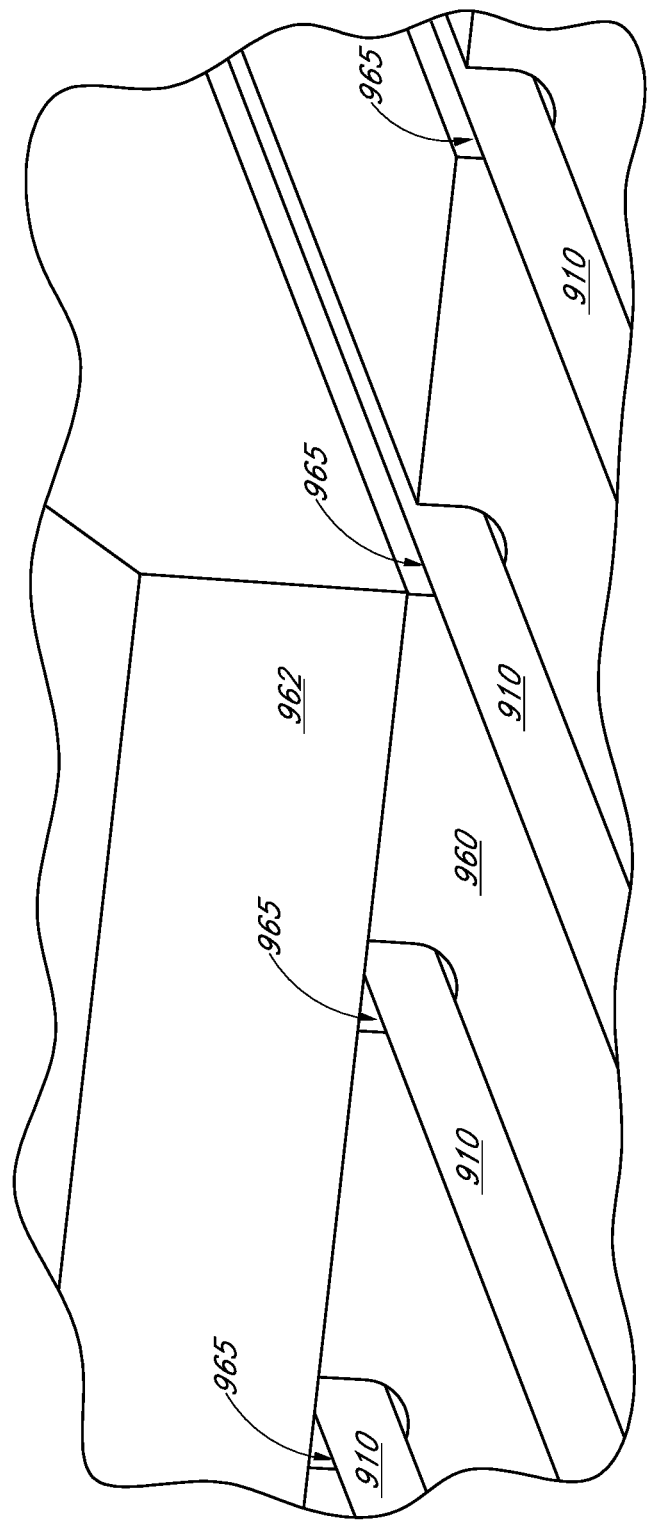

FIGS. 9A, 9B and 9C illustrate another example system for electrically coupling solar cells 900, according to some embodiments. In an embodiment, the methods described in FIGS. 1-7 can be used with the system of FIGS. 9A, 9B and 9C. As shown, the system for electrically coupling solar cells 900 of FIGS. 9A, 9B and 9C have similar reference numbers to elements of the system 700 of FIGS. 7A and 7B, where like reference numbers refer to similar elements throughout the figures. In an embodiment, the structure of the system 900 of FIGS. 9A, 9B and 8C are substantially similar to the structure of the system 700 of FIGS. 7A and 7B, except as described below. Unless otherwise specified below, the numerical indicators used to refer to components in FIGS. 9A, 9B and 9C are similar to those used to refer to components or features in FIGS. 7A and 7B above, except that the index has been incremented by 200. Therefore the description of corresponding portions of FIGS. 7A and 7B apply equally to the description of FIGS. 9A, 9B and 9C, except as described below.

With reference to FIG. 9A, a cross-sectional view of another system for electrically coupling solar cells 900 is shown, according to some embodiments. In an embodiment, the system for electrically coupling solar cells 900 can include a roller 934 and a first aligner 932. In one embodiment, a plurality of cut portions 910 of a conductive foil can be placed through the aligner 932, where the aligner 932 aligns the plurality of cut portions 910 to doped regions of a semiconductor substrate 920. In an example, the semiconductor substrate 920 is a solar cell. In an embodiment, the doped regions are P-type or N-typed doped regions. In one embodiment, the aligner 932 allows for the plurality of cut portions 910 to be placed over the semiconductor substrate 920. In one embodiment, the aligner 932 can align the plurality of cut portions 910 substantially parallel to doped regions of the semiconductor substrate 920. In an embodiment, a roller 938 can bond the plurality of cut portions 910 to the doped regions of the semiconductor substrate 920. In an embodiment, the aligner 932 can movement of the plurality of cut portions 910 in contact with the roller 934. In an embodiment, the aligner 932 can align plurality of cut portions 910 substantially parallel to the doped regions of the semiconductor substrate 920 to form a pairing of the semiconductor substrate 920 and the cut portions 910. In one embodiment, the roller 934 is heated. In an embodiment, the roller 934 can apply a mechanical force to the semiconductor substrate 920 to bond the cut portions 910 to the semiconductor substrate 920. In an embodiment, the mechanical force can be applied to a pairing of the semiconductor substrate 920 and the cut portions 910 to bond the cut portions 910 to the semiconductor substrate 920. In an embodiment, a fixture 964 can couple the roller 934 to the aligner 932. In an embedment, the aligner 932 can include a first portion 962 and a second portion 960.

With reference to FIG. 9B, a plan view of the system for the electrically coupling solar cells 900 of FIG. 9A is shown, according to some embodiments. In one embodiment, the first portion 962 of the aligner 932 is a cover plate. In an example, the cover plate 962 can be placed over the second portion 960 of the plurality of cut portions 932. In an embodiment, the cover plate 960 can include a magnet 961. In an embodiment, the magnet 961 can inhibit movement of the cover plate 960. In an embodiment, the fixture 964 can be coupled to the aligner 932 through the second portion 960.

Referring to FIG. 9C, a plan view of first and second portion of the aligner 932 of FIG. 9A is shown, according to some embodiments. In an embodiment, as shown, the first portion 962 is a cover plate. In an embodiment, the cover plate 962 can cover the second portion 960. In an embodiment, the cover plate 962 can inhibit the plurality of cut portions 910 from moving and/or inhibits misalignment of the plurality of cut portions 910 during a bonding process. In an embodiment, the second portion 960 of the aligner 932 of FIG. 9A can include the plurality of slots 965 to receive the plurality of cut portions 910. In an embodiment, the cover plate 962 inhibits movement of the plurality of cut portions 910 to adjacent slots 965. In an embodiment, the plurality of slots 965 can inhibit misalignment of the plurality of cut portions 810 and/or align the plurality of cut portions substantially parallel to doped regions of the semiconductor substrate 820 during a bonding process. In an embodiment, the plurality of slots 965 inhibits lateral movement of the plurality of cut portions during the bonding.

Methods of fabricating a solar cell, and system for electrically coupling solar cells, are described. A method of fabricating a solar cell can include forming a first cut portion from a conductive foil. The method can include aligning the first cut portion to a first doped region of a first semiconductor substrate, wherein the first cut portion is aligned substantially parallel to the first doped region and bonding the first cut portion to the first doped region.

Another method of fabricating a solar cell can include forming a first cut portion and a second cut portion from a conductive foil. The method can include aligning the first cut portion to a first doped region and aligning the second cut portion to a second doped region of a first semiconductor substrate and bonding the first cut portion to the first doped region and second cut portion to the second doped region.

Yet another method of fabricating a solar cell can include forming a first cut portion and a second cut portion from a conductive foil. The method can include forming a third cut portion and a fourth cut portion from the first cut portion. The method can include forming a fifth cut portion and a sixth cut portion from the second cut portion. The method can include aligning the third cut portion and a fourth cut portion to a first doped region and a second doped region of a first semiconductor substrate. The method can include aligning the fifth cut portion and a sixth cut portion to a third doped region and a fourth doped region of the first semiconductor substrate. The method can include bonding the third cut portion and a fourth cut portions to the first and second doped regions of the first semiconductor substrate and bonding the fifth and sixth cut portions to the third and fourth doped regions of the first semiconductor substrate.

A system for electrically coupling solar cells can include a first separation unit for forming a first cut portion and a second cut portion from a conductive foil and a bonding unit for bonding the first and second cut portion to a first and second doped region of a semiconductor substrate.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming a first cut portion from a conductive foil;
    aligning the first cut portion to a first doped region of a first semiconductor substrate, wherein the first cut portion is aligned substantially parallel to the first doped region, wherein aligning the first cut portion to the first doped region of the first semiconductor substrate comprises placing the first cut portion in an aligner having a plurality of slots; and
    bonding the first cut portion to the first doped region.

2. The method of claim 1, wherein forming the first cut portion of the conductive foil comprises cutting, slitting or tearing the conductive foil.

3. The method of claim 1, wherein forming the first cut portion from the conductive foil comprises applying a knife, saw, a laser or performing a water-jet slitting process to form the first cut portion.

4. The method of claim 1, further comprising, prior to forming the first cut portion from the conductive foil, conveying the conductive foil from a first location to a second location, wherein the conveying positions the conductive foil over the first semiconductor substrate.

5. The method of claim 1, wherein aligning the first cut portion to the first doped region comprises aligning the first cut portion to a first doped region located on a back side or a front side of the first semiconductor substrate.

6. The method of claim 1, wherein aligning the first cut portion to the first doped region comprises aligning the first cut portion to a N-type or P-type doped region of the first semiconductor substrate.

7. The method of claim 1, wherein bonding the first cut portion comprises performing a laser welding process, thermocompression process or an ultrasonic bonding process.

8. A method of fabricating a solar cell, the method comprising:
   forming a first cut portion and a second cut portion from a conductive foil;
   aligning the first cut portion to a first doped region and aligning the second cut portion to a second doped region of a first semiconductor substrate, wherein aligning the first and second cut portions to the first and second doped regions, respectively, comprises aligning the first and second cut portions to a first and second doped region located on a back side of the first semiconductor substrate;
   bonding the first cut portion to the first doped region and second cut portion to the second doped region;
   forming a third cut portion from the conductive foil;
   aligning the third cut portion to a third doped region of the first semiconductor substrate, wherein aligning the third cut portion to a third doped region of the first semiconductor substrate comprises aligning the third cut portion to a third doped region disposed on a front side of the first semiconductor substrate; and
   bonding the third cut portion to the third doped region.

9. The method of claim 8, wherein forming a first cut portion and a second cut portion from a conductive foil comprises forming a gap between the first cut portion and the second cut portion and wherein the gap is greater than or equal to a width between a first doped region and a second doped region of the semiconductor substrate.

10. The method of claim 8 wherein aligning the first and second cut portions to the first and second doped regions comprises spreading the first cut portion away from the second cut portion to align to the first cut portion to the first doped region and second cut portion to the second doped region.

11. A system for electrically coupling solar cells, the system comprising:
   a first separation unit for forming a first cut portion and a second cut portion from a conductive foil;
   a bonding unit for bonding the first and second cut portion to a first and second doped region of a semiconductor substrate; and
   an aligner to align the first cut portion and a second cut portion with the first and second doped regions of the semiconductor substrate, wherein the aligner has a plurality of slots.

12. The system of claim 11, wherein the separation unit comprises a knife, saw or a laser.

13. The system of claim 11, wherein the bonding unit comprises a thermocompression roller, a laser welder or an ultrasonic bonding apparatus.

14. The system of claim 11, further comprising a second separation to form a third and fourth cut portion from the first cut portion.

* * * * *